United States Patent [19]

Kaufman

[11] Patent Number: 4,564,398

[45] Date of Patent: Jan. 14, 1986

[54] OPTIMIZED PHOTOVOLTAIC EFFECT

[75] Inventor: R. Gilbert Kaufman, Chicago, Ill.

[73] Assignee: Standard Oil Company (Indiana), Chicago, Ill.

[21] Appl. No.: 690,671

[22] Filed: Jan. 11, 1985

[51] Int. Cl.⁴ ............................................. H01L 31/00
[52] U.S. Cl. .................................................. 148/6.31
[58] Field of Search ........................ 136/265; 148/6.31

[56] References Cited

U.S. PATENT DOCUMENTS

| 2,038,246 | 4/1936 | Smith | 148/6.31 |
| 2,238,608 | 3/1941 | Sieberth | 148/6.31 |
| 2,793,968 | 5/1957 | Irby | 148/6.31 |
| 3,398,028 | 8/1968 | Scott | 148/6.31 |

Primary Examiner—Sam Silverberg
Attorney, Agent, or Firm—Richard A. Kretchmer; William T. McClain; William H. Magidson

[57] ABSTRACT

Thin films of cuprous oxide on thin copper foil, when heat treated in an inert atmosphere and quenched, exhibit a 10- to 100-fold increase in photovoltaic effect.

20 Claims, No Drawings

OPTIMIZED PHOTOVOLTAIC EFFECT

BACKGROUND OF THE INVENTION

This invention relates to improved photovoltaic effects in thin films of cuprous oxide on thin copper foil.

Photovoltaic generation of electric current has become a subject of great interest as increased attention has been given to means for the utilization of solar energy, specifically the generation of electricity from sunlight. Photovoltaic effects depend upon the development of semi-conductor PN junctions, which in turn depend upon the creation and stabilizing of electron holes in the selected lattice structure. In a commonly employed system, silicon crystals are doped with boron and with phosphorus atoms to produce, respectively, P-type material and N-type material. P-type material, due to an electron deficiency, attracts electrons and thus appears to act like a positive material. Conversely, N-type material, having a supply of free electrons, acts like a negative material. When P- and N-type materials are fused together, free electrons from the N-type material flow into the holes in the P-type material. The resulting PN junction provides the fundamental unit for the modern solar cell. Photovoltaic processes are not limited to single-crystal or polycrystalline silicon. Other common systems employ germanium, copper-cadmium sulfide, or gallium arsenide. Less common, but effective, systems employ cuprous oxide in contact with metallic copper. The cuprous oxide-copper system is an attractive one because of the lower materials cost but its use in solar cells has been limited because of poor efficiency.

In U.S. Pat. No. 3,398,028, Scott reported the formation of a cuprous oxide coating on copper by heating a copper base alloy to a temperature in the range 600°–1050° C. in an inert atmosphere and then cooling in an atmosphere containing a very limited proportion (about 0.0001%) of oxygen. Barnett, et al., U.S. Pat. No. 4,239,553 relates to solar cells comprising a copper sulfide absorber layer protected by a thin copper oxide layer, the entire system being encapsulated in glass for increased durability and maintenance of efficiency. In another solar cell, Rothwarf U.S. Pat. No. 4,267,398 provides a layer of copper oxide adjacent to the absorber material.

Photovoltaic properties of single-crystal and polycrystalline cuprous oxide-copper contacts were studied extensively by Assimos et al., *J. Appl. Phys.*, vol. 44, pp. 1,687–1,693 (1973). Single-crystal cuprous oxide was reduced to metallic copper employing atomic hydrogen at room temperature. Polycrystalline contacts were prepared by partial oxidation of copper plate in air at 1000° C. The copper plate was 2 mm. thick and the resulting oxide layer was 150 microns in thickness. Herion, *Appl. Phys. Lett.*, vol. 34, pp. 599–601 (1979) oxidized a copper sheet (0.5 mm. thick) in air at 1050° C. for 1 minute to obtain a cuprous oxide layer (20 microns thick) having very good adherence. Fortin et al., *Can. J. Phys.*, vol. 60, pp. 901–908 (1982), prepared a 1-micron layer of cuprous oxide on a copper film (1 mm. thick) by employing a high oxygen pressure (50 Torr.) at 960° C. for less than 1 second exposure time.

The process of this invention, employing very thin films of copper foil, surprisingly has produced unusually large photovoltaic effects, under process conditions not suggested by the prior art.

SUMMARY OF THE INVENTION

The process of this invention relates to the production of a photovoltaic film of cuprous oxide on a very thin metallic copper foil by heating the foil in an oxygen-containing atmosphere at an elevated temperature. Thereafter the oxidized foil is heat treated and quenched to ambient temperature to provide a 10- to 100-fold increase in the photovoltaic effect observed at the copper-cuprous oxide junction. These process results are achieved when employing copper foil having a thickness no greater than 0.005 inch, desirably about 0.002 inch, to provide a cuprous oxide film preferably having a thickness of about 20 microns. The critical heat treatment is effected in a substantially oxygenfree atmosphere, usually for at least about 15 minutes at a temperature ranging from about 300° to about 700° C., preferably at about 500° C. Subsequent quenching of the oxidized foil is conveniently effected with water. This treatment leaves the cuprous oxide film in surprisingly good optical condition such that no etching, polishing or grinding is required to optimize the optical properties of the film. Accordingly, electrical and optical contacts may be made directly.

The process of this invention further relates to the continuous production of a photovoltaic film of cuprous oxide on a thin metallic copper strip under conditions substantially as set forth above.

Such films find particular use in various configurations suitable for solar cells and related energy conservation devices.

DESCRIPTION OF THE INVENTION

This invention relates to a novel and improved process for the production of a photovoltaic film of cuprous oxide on copper metal. Although the formation of such films on various copper surfaces is old, the process of this invention provides an increase of one to two magnitudes in the observed photovoltaic effect. In this novel process, thin films of cuprous oxide on thin copper foil are heat treated and quenched to achieve this optimized effect.

Photovoltaic films of cuprous oxide on copper are attractive because of the abundance and low cost of the required materials. The cuprous oxide film adheres well to copper which provides a stable support for the fragile film as well as providing an excellent rectifying electrical contact to the film.

Prior art studies of cuprous oxide-copper systems have concluded that defect concentration is inherently at a low level and that heat treatment would have no effect. Contrary to this teaching, it is believed that the conductivity results achieved by this novel process are due to induced variations in the concentration of vacancies in the copper atoms of the cuprous oxide crystal system, an intrinsic P-type conductor, and to the relief of stress in the cuprous oxide film by leaving a minimum amount of copper metal (the cause of the stress) after oxidation.

It has been found that in the process of this invention, conductivity levels increase regularly with heat treatment at increasing temperatures in the range from 300° to 500° C. As the heat treating temperature is increased further, the conductivity level decreases although the improved performance of this invention is still observed at 700° C., suggesting the thermally activated formation of free copper defects from clusters of defects and, at the higher temperatures, the destruction of such defects at convenient cuprous oxide surfaces to provide progressively fewer effective defect sites.

The novel process of this invention has been found to be effective only with relatively thin copper sheet or foil, having a thickness no greater than about 0.005 inch, preferably from about 0.001 to about 0.005 inch, and most preferably about 0.002 inch. Progressively poorer results have been observed with greater thicknesses of copper foil such that the cuprous oxide film (ca. 20 microns) cracked and peeled when developed on a foil that was 0.02 inch thick, thus showing the stress induced in the cuprous oxide film. Prior art studies have been limited to the use of copper plates whose thickness was at least 0.04 inch.

The metallic copper surface may be cleaned in any conventional manner and subjected to oxidation at substantially atmospheric pressure in the presence of an oxygen-containing gas, generally air, or from about 0.1 to about 10.0 vol. % oxygen in argon, preferably about 1.0 vol. % oxygen in argon, and at a temperature within the range from about 900° to about 1100° C., preferably about 1000° C. The oxidation time under the aforesaid conditions should be chosen to provide a cuprous oxide film, on the surface of the metallic copper, whose thickness is desirably within the range from about 10 to about 25 microns, preferably about 20 microns. The oxidation time is generally found to be within the range from about 1 to about 5 minutes, preferably about 2 minutes.

The novel heat treatment of this invention may be effectively conducted at any temperature within the range from about 300° to about 700° C. Best conductivity results have been achieved at or near the preferred heat treating temperature of about 500° C. It is essential that the heat treatment be conducted in the absence of oxygen. The required oxygen-free gas atmosphere is conveniently provided by an inert gas such as argon, nitrogen, or neon, or mixtures thereof, although other inert gases may be employed. A preferred gaseous medium is argon. The heat treatment at the selected temperature should be applied for an effective period of time which has usually been found to be about 15 minutes, although a treating time within the range from about 10 to about 60 minutes has been observed to provide the surprisingly enhanced conductivity described herein.

The quenching step is intended to reduce the temperature of the cuprous oxide-copper system to substantially ambient temperature. This may preferably be effected with water, as, for example, a spray or mist, although any suitable quenching agent may be employed.

The resulting cooled film may be stored in any conventional manner for use as desired. The optical condition of the film is unusually good, so that there is no need to etch, polish or grind the surface to optimize the optical properties. In consequence of this surprising result, electrical and optical contacts can be made to the film without further preparation. One attractive use of the films made by the process of this invention is in a battery system powered by solar energy.

In another attractive aspect of this invention, the process described above is adapted to the continuous production of a photovoltaic film of cuprous oxide on copper on an elongated, rolled strip of copper foil. The foil strip is led through successive zones for oxidation, heat treatment, and quenching to occur under conditions of time, temperature, and medium, as previously described. After drying, the product strip is taken up on a storage roll for subsequent use.

The following examples are illustrative, without limitation, of the process of this invention.

EXAMPLE I

A square of copper foil, ½ in. by ½ in., having a thickness of 0.002 in., was placed on the end of a thermocouple tube, serving as a sample holder, and then introduced into a quartz sample tube. While still at room temperature the sample tube was continuously flushed with pure titanium-gettered argon gas to remove all oxygen and thus prevent seeding of cuprous oxide prior to the oxidation step. The sample tube was then inserted into a quartz furnace tube, within a furnace maintained at 1000° C., by means of a programmed stepper motor.

Once the copper foil had gradually reached a temperature of 1000° C., gas flow in the sample tube was switched to argon containing 1 vol. % oxygen for 2 minutes, to effect formation of cuprous oxide. Thereafter the sample tube was flushed with argon gas, containing up to about 1 p.p.m. oxygen (with no apparent effect on the photovoltaic properties of the prepared optical surface film of cuprous oxide), while withdrawing the sample tube from the furnace by means of the programmed stepper motor. The sample was then permitted to cool to room temperature.

Heat treatment was then effected by suspending the oxidized square of copper foil, now having a cuprous oxide film thereon, within a vertical furnace that had been preheated to 500° C. The square, while continuously flushed with substantially oxygen-free argon gas, was maintained at 500° C. for 15 minutes. The square was then quenched by dropping directly into a container of water at room temperature.

EXAMPLE II

The procedure of Example I was repeated with the cooled, oxidized copper foil square having an array of nine carbon paste dots (in a 3×3 arrangement) screen-printed on the cuprous oxide surface. After heat treatment and quenching, the residual carbon dots provided contact to thin metallic copper spots distributed upon the cuprous oxide surface.

EXAMPLES III-IX

The procedure of Example II was repeated with the heat treatment being conducted at the following seven temperatures: 250°, 350°, 400°, 450°, 550°, 600°, and 650° C.

EXAMPLE X

The product squares prepared in Examples II-IX were each tested for photovoltaic properties. A small area of one corner of each copper foil was scraped clean so that electrical contact could be made to the copper metal base. A second electric contact was made to each of the residual carbon dots in turn (designated as dots 1, 2 and 3 in rows A, B and C). The cuprous oxide film was exposed to a fixed microscope lamp and the short-circuit current thereby generated was measured.

Results presented in Table 1 show a maximum current generated when heat treatment had been at 500° C., with significant currents found for other heat treatments between 350° and 650° C.

EXAMPLES XI–XIV

The procedure of Example II was repeated, employing copper foil squares having respective thickness of 0.002, 0.005, 0.010 and 0.020 inch. Copper oxide films were produced by oxidation at 950° C. for 1 minute in argon gas containing 10 vol. % oxygen.

EXAMPLE XV

Photovoltaic properties of the products of Examples XI–XIV were measured as in Example X. Results presented in Table 2 clearly show an optimized current generated at the 0.002 in. thickness.

EXAMPLE XVI

Resistances were measured across the cuprous oxide film on the foil squares produced according to Examples II, V, VI, VII, VIII and IX (between the copper base and the carbon dots).

Results presented in Table 3 indicate that the minimum resistance was observed when the heat treatment had been conducted at 500° C.

TABLE 1

| Location | Photovoltaic Properties[a] | | | | | | | |
|---|---|---|---|---|---|---|---|---|
| | Heat Treatment, °C. | | | | | | | |
| of Dot | 250 | 350 | 400 | 450 | 500 | 550 | 600 | 650 |
| A-1 | .0134 | .0271 | .0585 | .0560 | .0640 | .0463 | .0624 | .0408 |
| A-2 | .0129 | .0271 | .0585 | .0560 | .0640 | .0463 | .0624 | .0408 |
| A-3 | .0136 | .0240 | .0535 | .0560 | .0572 | .0458 | .0620 | .0345 |
| B-1 | .0112 | .0235 | .0440 | .0435 | .0512 | .0413 | .0460 | .0324 |
| B-2 | .0086 | .0175 | .0234 | .0345 | .0400 | .0323 | .0420 | .0278 |
| B-3 | .0083 | .0160 | .0320 | .0355 | .0470 | .0258 | .0398 | .0199 |
| C-1 | .0090 | .0090 | .0165 | .0320 | .0412 | .0605 | .0362 | .0440 |
| C-2 | .0090 | .0208 | .0292 | .0350 | .0507 | .0325 | .0396 | .0288 |
| C-3 | .0097 | .0181 | .0315 | .0330 | .0433 | .0259 | .0365 | .0240 |
| Average | .0106 | .0209 | .0386 | .0426 | .0526 | .0370 | .0480 | .0307 |

[a] Short-circuit current (milliamperes) generated by fixed microscope lamp.

TABLE 2

| Location | Photovoltaic Properties[a] | | | |
|---|---|---|---|---|
| | Foil Thickness, in. | | | |
| of Dot | .002 | .005 | .010 | .020 |
| A-1 | .0220 | .0080 | .0083 | .0092 |
| A-3 | .0016 | .0055 | .0049 | .0052 |
| B-1 | .0150 | .0098 | .0054 | .0080 |
| B-3 | .0148 | .0042 | .0054 | .0042 |
| C-1 | .0192 | .0075 | .0064 | .0080 |
| C-3 | .0142 | .0061 | .0050 | .0045 |
| Average | .0161 | .0069 | .0059 | .0065 |

[a] Short-circuit current (milliamperes) generated by fixed microscope lamp.

TABLE 3

| Location | Resistance, ohms | | | | | |
|---|---|---|---|---|---|---|
| | Heat Treatment, °C. | | | | | |
| of Dot | 400° | 450° | 500° | 550° | 600° | 650° |
| A-1 | 180 | 170 | 100 | 170 | 160 | 700 |
| A-2 | 330 | 260 | 105 | 250 | 300 | 740 |
| A-3 | 170 | 166 | 75 | 230 | 240 | 1070 |
| B-1 | 400 | 380 | 110 | 140 | 170 | 1140 |
| B-2 | 450 | 420 | 118 | 250 | 150 | 1500 |
| B-3 | 150 | 210 | 69 | 77 | 150 | 1800 |
| C-1 | 650 | 400 | 110 | 170 | 115 | 1200 |
| C-2 | 440 | 360 | 95 | 150 | 125 | 1300 |
| C-3 | 230 | 260 | 67 | 93 | 80 | 650 |
| Average | 333 | 292 | 94 | 170 | 166 | 1120 |

I claim:

1. A process for the production of an optimized photovoltaic film of cuprous oxide on copper metal by the oxidation of copper at an elevated temperature, comprising the steps of:
    (a) providing a metallic copper foil having a thickness no greater than about 0.005 inch;
    (b) oxidizing the copper foil in the presence of an oxygen-containing gas at a temperature within the range from about 900° C. to about 1100° C. to provide a surface film layer of cuprous oxide;
    (c) thereafter heat treating the oxidized copper foil at a temperature within the range from about 300° to about 700° C. in a substantially oxygen-free inert gas atmosphere; and
    (d) quenching the heat treated, oxidized copper foil to substantially ambient temperature.

2. The process of claim 1 wherein the thickness of the metallic copper foil is within the range from about 0.001 to about 0.005 inch.

3. The process of claim 2 wherein the thickness of the metallic copper foil is about 0.002 inch.

4. The process of claim 1 wherein the copper foil is oxidized in the presence of an oxygen-containing gas at atmospheric pressure and at a temperature within the range from about 900° to about 1100° C.

5. The process of claim 4 wherein the oxygen-containing gas is argon, containing about 1.0 vol. % oxygen.

6. The process of claim 4 wherein the temperature is about 1000° C.

7. The process of claim 4 wherein the surface layer of cuprous oxide has a thickness within the range from about 10 to about 25 microns.

8. The process of claim 7 wherein the thickness of the cuprous oxide layer is about 20 microns.

9. The process of claim 1 wherein the heat treating step is conducted at a temperature of about 500° C.

10. The process of claim 1 wherein the heat treating step is conducted in the presence of an inert gas selected from the class consisting of argon, nitrogen, neon, and mixtures thereof.

11. The process of claim 1 wherein the heat treated, oxidized copper foil is quenched in water.

12. A process for the continuous production of an optimized photovoltaic film of cuprous oxide on a metallic copper strip, comprising the steps of:
    (a) providing, on a first roll, an elongated strip of copper foil whose thickness is within the range from about 0.001 to about 0.005 inch;
    (b) feeding the strip of copper foil, at a controlled linear speed, through an oxidation zone, including an oxygen-containing gas maintained at a temperature within the range from about 900° to about 1100° C., to effect the formation of a surface layer of cuprous oxide on said metallic copper foil;
    (c) passing the oxidized copper foil strip into a substantially oxygen-free, heat-treating zone, containing an inert gas maintained at a temperature within the range from about 300° to about 700° C.;
    (d) conducting the heat-treated, oxidized copper foil strip through a quenching zone, while spraying with a quenching liquid to effect cooling to substantially ambient temperature;
    (e) drying the cooled, oxidized copper foil strip; and
    (f) taking up the oxidized copper foil strip on a second roll.

13. The process of claim 12 wherein the thickness of the copper foil strip is about 0.002 inch.

14. The process of claim 12 wherein the oxidation zone includes an oxygen-containing gas stream comprising air.

15. The process of claim 12 wherein the oxidation temperature is about 1000° C.

16. The process of claim 12 wherein the controlled linear speed through the oxidation zone is selected to permit formation of a surface cuprous oxide layer having a thickness within the range from about 10 to about 25 microns.

17. The process of claim 16 wherein the thickness of the cuprous oxide layer is about 20 microns.

18. The process of claim 12 wherein the heat treating zone is maintained at a temperature of about 500° C.

19. The process of claim 12 wherein the inert gas in the heat-treating zone is selected from the class consisting of argon, neon, nitrogen, and mixtures thereof.

20. The process of claim 12 wherein the quenching liquid is water.

* * * * *